(12) United States Patent
Yoo et al.

(10) Patent No.: US 11,228,337 B2
(45) Date of Patent: Jan. 18, 2022

(54) APPARATUS WITH TRANSMISSION ROUTE SWITCHING OF RADIO FREQUENCY SIGNALS AND RADIO FREQUENCY MODULE

(71) Applicant: Samsung Electro-Mechanics Co., Ltd., Suwon-si (KR)

(72) Inventors: Hyun Jin Yoo, Suwon-si (KR); Young Sik Hur, Suwon-si (KR); Hyeon Seok Hwang, Suwon-si (KR); Si Heon Kwak, Suwon-si (KR); Yoo Sam Na, Suwon-si (KR); Ju Yeon Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/930,198

(22) Filed: Jul. 15, 2020

(65) Prior Publication Data

US 2021/0306025 A1    Sep. 30, 2021

(30) Foreign Application Priority Data

Mar. 24, 2020 (KR) .......................... 10-2020-0035385

(51) Int. Cl.
| | |
|---|---|
| *H04B 1/48* | (2006.01) |
| *H03F 3/24* | (2006.01) |
| *H03K 17/56* | (2006.01) |
| *H01Q 1/38* | (2006.01) |

(52) U.S. Cl.
CPC .................. *H04B 1/48* (2013.01); *H01Q 1/38* (2013.01); *H03F 3/245* (2013.01); *H03K 17/56* (2013.01); *H03F 2200/451* (2013.01)

(58) Field of Classification Search
CPC .. H04B 1/48; H01Q 1/38; H03F 3/245; H03F 2200/451; H03K 17/56
USPC ...................................... 455/78–83
See application file for complete search history.

(56) References Cited

U.S. PATENT DOCUMENTS

| | | | |
|---|---|---|---|
| 7,369,096 B2 | 5/2008 | Castaneda et al. | |
| 2006/0250197 A1* | 11/2006 | Petrovic | H01P 1/15 333/101 |
| 2011/0158135 A1* | 6/2011 | Mikhemar | H03H 11/42 370/277 |
| 2014/0139298 A1 | 5/2014 | Kim et al. | |
| 2019/0181841 A1* | 6/2019 | Visser | H03H 7/42 |

FOREIGN PATENT DOCUMENTS

| | | |
|---|---|---|
| JP | 4678571 B2 | 4/2011 |
| KR | 10-2014-0064095 A | 5/2014 |

\* cited by examiner

*Primary Examiner* — Lee Nguyen
(74) *Attorney, Agent, or Firm* — NSIP Law

(57) ABSTRACT

An apparatus for switching a transmission route of a radio frequency signal is provided. The apparatus may include a first inductor electrically connected to first and second ports; a second inductor electrically connected to the third and fourth ports and disposed to have mutual inductance with the first inductor; first, second, third, and fourth switches configured to switch an electrical connection between the first, second, third, and fourth ports and a ground, respectively; wherein the first and second inductors are electrically connected to the ground through one of the first and second switches and one of the third and fourth switches such that a radio frequency signal pass between one of the first and second ports an one of the third and fourth ports.

17 Claims, 13 Drawing Sheets

APPARATUS WITH TRANSMISSION ROUTE SWITCHING OF RADIO FREQUENCY SIGNALS AND RADIO FREQUENCY MODULE

CROSS-REFERENCE TO RELATED APPLICATION(S)

This application claims the benefit under 35 USC 119(a) of Korean Patent Application No. 10-2020-0035385 filed on Mar. 24, 2020, in the Korean Intellectual Property Office, the entire disclosure of which is incorporated herein by reference for all purposes.

BACKGROUND

1. Field

The following description relates to a radio frequency signal transmission route switching apparatus and a radio frequency module.

2. Description of Related Art

Recently, electronic devices such as smartphones provide communications corresponding to various communication specifications (e.g., global system for mobile communications (GSM), enhanced data for global evolution (EDGE), code-division multiple access (CDMA), universal mobile telecommunications system (UMTS), wideband code division multiple access (WCDMA), and long term evolution (LTE), and can also provide communications corresponding to a higher frequency wave band such as, for example, fifth generation (5G) or millimeter wave (mmWave).

Electronic devices may also include modules that convert a radio frequency signal transmission route such that a communication device may be effectively provided. Typically, the module that converts a radio frequency signal transmission route may perform a conversion operation between a receiving route and a transmission route of a radio frequency signal, as well as a route between a plurality of transmission routes of the communication device.

However, the device that switches a radio frequency signal transmission route may be implemented as an attenuating element or a non-linear element of a transmitted radio frequency signal, and such an attenuating/non-linear element may have a more significant effect on performance of the communication device as a frequency corresponding to the communication device increases.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a transmission route radio frequency signal switching apparatus, includes a first inductor electrically connected to a first port and a second port, among the first port, the second port, a third port, and a fourth port, each configured to allow a radio frequency signal to pass therethrough; a second inductor electrically connected to the third port and the fourth port, and disposed to have mutual inductance with the first inductor; a first switch configured to switch an electrical connection between the first port and a ground; a second switch configured to switch an electrical connection between the second port and the ground; a third switch configured to switch an electrical connection between the third port and the ground; and a fourth switch configured to switch an electrical connection between the fourth port and the ground; wherein the first inductor and the second inductor are electrically connected to the ground through one of the first switch and the second switch, and one of the third switch and the fourth switch such that a radio frequency signal passes between one of the first port and the second port, and one of the third port and the fourth port.

The first inductor and the second inductor may be configured to operate in one of: a first transmission route mode configured to provide a first transmission route between the first port and the fourth port when the second switch and the third switch are turned on, and the first switch and the fourth switch are turned off; a second transmission route mode configured to provide a second transmission route between the first port and the third port when the second switch and the fourth switch are turned on, and the first switch and the third switch are turned off; a third transmission route mode configured to provide a third transmission route between the second port and the third port when the first switch and the fourth switch are turned on, and the second switch and the third switch are turned off; and a fourth transmission route mode configured to provide a fourth transmission route between the second port and the fourth port when the first switch and the third switch are turned on, and the second switch and the fourth switch are turned off.

The apparatus may include a controller configured to respectively provide first to fourth control signals to the first to fourth switches such that one of the first to fourth transmission routes is selected.

At least one of the first to fourth switches comprises a plurality of transistors directly connected to each other, and wherein the plurality of the transistors are switched into an on/off state based on at least one of a voltage and a current of the first to fourth control signals.

The apparatus may include transmission amplifier configured to amplify a transmission radio frequency signal and deliver the amplified transmission radio frequency signal to the first port; and a receiving amplifier configured to receive a receiving radio frequency signal from the second port and amplify the received receiving radio frequency signal.

The apparatus may include a third inductor electrically connected between a fifth port and the ground; a fourth inductor disposed to have mutual inductance with the third inductor, and electrically connected between an input terminal of the transmission amplifier and an output terminal of the receiving amplifier; a fifth switch configured to switch an electrical connection between the input terminal of the transmission amplifier and the ground; and a sixth switch configured to switch an electrical connection between the output terminal of the receiving amplifier and the ground.

The first inductor and the second inductor may be disposed such that an overlapped area in a winding axis of the first inductor and the second inductor is bigger than a non-overlapped area.

A center frequency of a radio frequency signal pass band of the first inductor and the second inductor may be higher than 20 GHz.

A first end of the second inductor may be electrically connected to a first antenna, and a second end of the second inductor may be electrically connected to a second antenna.

In a general aspect, a radio frequency module includes a substrate; a first antenna disposed on the substrate, and configured to form a first radiation pattern in a first direction of the substrate; a second antenna disposed on the substrate, and configured to form a second radiation pattern in a second direction of the substrate; and a switch configured to control a radio frequency signal transmission route disposed on the substrate, and electrically connected to the first antenna and the second antenna, wherein the switch configured to control a radio frequency signal transmission route comprises: a second inductor electrically connected between the first antenna and the second antenna; a first inductor disposed to have mutual inductance with the second inductor; a first switch configured to switch an electrical connection between a first end of the first inductor and a ground; a second switch configured to switch an electrical connection between a second end of the first inductor and the ground; a third switch configured to switch an electrical connection between a first end of the second inductor and the ground; and a fourth switch configured to switch an electrical connection between a second end of the second inductor and the ground.

The switch configured to control a radio frequency signal transmission route may further include a transmission amplifier configured to amplify a transmission radio frequency signal and deliver the amplified transmission radio frequency signal to the first end of the first inductor; and a receiving amplifier configured to receive a receiving radio frequency signal from the second end of the first inductor and amplify the received receiving radio frequency signal.

The module may further include a radio frequency integrated circuit (RFIC) disposed on the substrate to be spaced apart from the switch configured to control a radio frequency signal transmission route, and configured to input or output a base signal and deliver or receive a radio frequency signal having a higher frequency than a base signal to or from the switch configured to control a radio frequency signal transmission route.

The module further includes a fourth inductor electrically connected between an input terminal of the transmission amplifier and an output terminal of the receiving amplifier; a third inductor disposed to have mutual inductance with the fourth inductor; a fifth switch configured to switch an electrical connection between the input terminal of the transmission amplifier and the ground; and a sixth switch configured to switch an electrical connection between the output terminal of the receiving amplifier and the ground, wherein a first end of the third inductor is electrically connected to the RFIC, and a second end of the third inductor is electrically connected to the ground.

The first antenna may include at least one patch antenna disposed biased to a first direction from a center of the substrate, and the second antenna may include at least one end-fire antenna disposed biased to a second direction from the center of the substrate.

The substrate may include a first insulating layer and a second insulating layer stacked on an upper surface or a lower surface of the first insulating layer, and the second insulating layer has a portion non-overlapped in a stacking direction, and is more flexible than the first insulating layer, and the first antenna may be disposed to overlap on the first insulating layer and the second insulating layer in the stacking direction, and the second antenna is disposed in a portion of the second insulating layer, non-overlapped with the first insulating layer in the stacking direction.

In a general aspect, a device includes a controller; a transmission amplifier; a receiving amplifier; a switching apparatus comprising: a first port connected to an output port of the transmission amplifier; a second port connected to an input port of the receiving apparatus; a third port connected to a first antenna, a fourth port connected to a second antenna; a first inductor electrically connected to the first port and the second port; a second inductor electrically connected to the third port and the fourth port; and a plurality of switches configured to selectively switch electrical connections between the first port, the second port, the third port, and the fourth port and a ground based on control signals from the controller.

Each of the plurality of switches comprise a plurality of transistors connected in series.

Other features and aspects will be apparent from the following detailed description, the drawings, and the claims.

Figure 1:
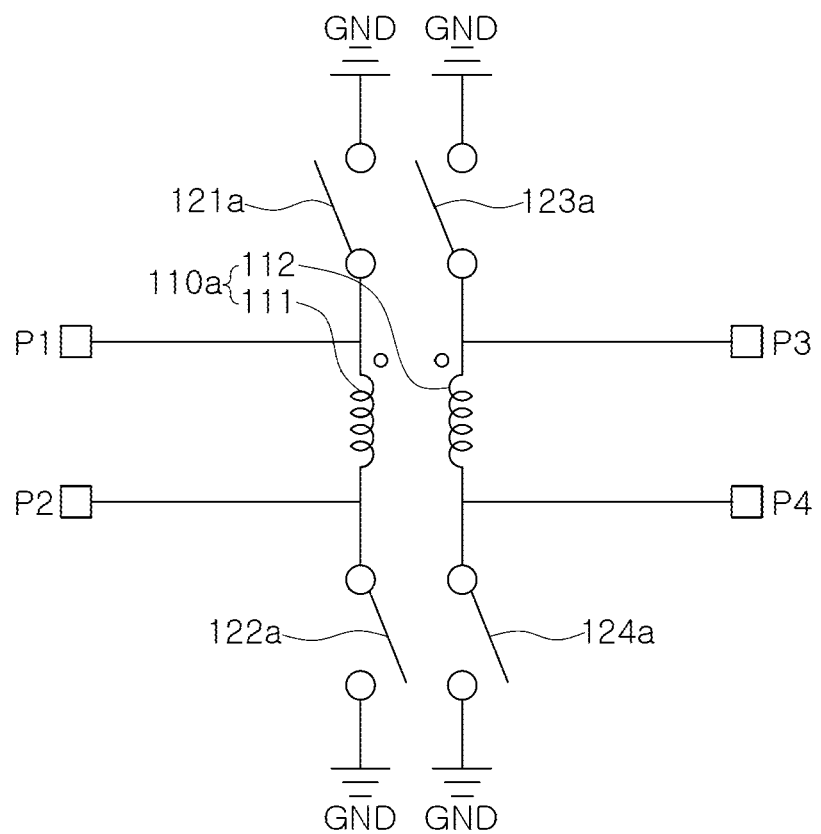
FIG. 1 illustrates an example apparatus for switching a transmission route of a radio frequency signal according to one or more exemplary embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

FIG. 1 illustrates an example apparatus for switching a transmission route of a radio frequency signal according to one or more exemplary embodiments.

Referring to FIG. 1, an apparatus 100a for switching a transmission route of a radio frequency signal according to one or more exemplary embodiments may include a first inductor 111, a second inductor 112, a first switch 121a, a second switch 122a, a third switch 123a and a fourth switch 124a, and may perform an operation of switching a transmission route of a radio frequency signal between first to fourth ports P1 to P4.

The first to fourth ports P1 to P4 may be configured to allow a radio frequency signal to pass therethrough. For example, the first to fourth ports P1 to P4 may be implemented as an impedance matching structure, a component, or a terminal of an integrated circuit, or an input or output terminal of a certain circuit (e.g., a transmission amplifier or a receiving amplifier).

The first inductor 111 may be electrically connected between the first and second ports P1 and P2.

The second inductor 112 may be electrically connected between the third and fourth ports P3 and P4, and may be disposed to have mutual inductance with the first inductor 111. As used herein, the expression that the first and second inductors 111 and 112 form mutual impedance means that inductance of each of the first and second inductors 111 and 112 is different from inductance of the first or second inductor 111 or 112 in the case in which only one of the first and second inductors 111 and 112 is disposed. For example, the first or second inductor 111 and/or 112 may be disposed in a single integrated circuit or a single printed circuit board to have mutual inductance.

The first and second inductors 111 and 112, disposed to have mutual inductance, may serve as a transformer 110a and may provide a transmission route of a radio frequency signal between the first and second inductors 111 and 112 through a current and a magnetic field corresponding to the radio frequency signal transmitted to one of the first and second inductors 111 and 112.

For example, the first and second inductors 111 and 112 may have a form in which a conductive wire, such as a coil, is wound, and may have inductance corresponding to a reference frequency (e.g., 28 GHz) of the radio frequency signal. For example, when the reference frequency of the radio frequency signal is 28 GHz, inductance of each of the first and second inductors 111 and 112 may be designed to be 190 pH. The inductance of the first and second inductors 111 and 112 may be determined based on parasitic capacitance of the apparatus 100a for switching a radio frequency signal transmission route and that of the switch.

The first switch 121a may switch an electrical connection between the first port P1 and a ground GND.

The second switch 122a may switch an electrical connection between the second port P2 and the ground GND.

The third switch 123a may switch an electrical connection between the third port P3 and the ground GND.

The fourth switch 124a may switch an electrical connection between the fourth port P4 and the ground GND.

In an example, each of the first to fourth switches 121a to 124a may be configured to electrically connect two terminals when turned on and break the connection between the two terminals when turned off. One of the two terminals may be electrically connected to the first or second inductor 111 or 112 while the other terminal may be electrically connected to the ground GND.

The first and second inductors 111 and 112 may be electrically connected to the ground GND through one of the first and second switches 121a and 122a and one of the third and fourth switches 123a and 124a such that a radio frequency signal passes between one of the first and second ports P1 and P2, and one of the third and fourth ports P3 and P4.

Accordingly, one terminal or the other terminal of the first inductor 111 may be electrically connected to the ground GND and one terminal or the other terminal of the second inductor 112 may be electrically connected to the ground GND.

Since, in an example, there are two routes through which the first inductor 111 is electrically connected to the ground GND, and two routes through which the second inductor 112 is electrically connected to the ground GND, a total number of examples in which the transformer 110a is connected to the ground may be 4.

A number of transmission routes provided by the apparatus 100a may correspond to a number of transmission routes of the transformer 110a in connection to the ground. That is, the apparatus 100a may provide 4 transmission routes through a single transformer 110a or through two inductors 111 and 112.

As the first and second inductors 111 and 112 of the transformer 110a are reactance elements, an attenuation ratio of a radio frequency passing through the transformer 110a may be lower than that passing through an active element such as a semiconductor transistor. Accordingly, an insertion loss of the apparatus 100a of the exemplary embodiments may be reduced. For example, the insertion loss of the apparatus 100a may be 1 dB or less.

As the first and second inductors 111 and 112 of the transformer 110a are passive elements, linearity (e.g., P1dB, IMD2, IMD3, or the like) of the radio frequency passing through the transformer 110a may be higher than linearity passing through an active element such as a semiconductor transistor.

Generally, passive elements, such as the first and second inductors 111 and 112, may be larger than an active element such as a semiconductor transistor.

However, as the apparatus 100a for switching a radio frequency signal transmission route of the exemplary embodiments can provide 4 transmission routes through a single transformer 110a or two inductors, various transmission routes can be provided for sizes of the first and second inductors 111 and 112.

Ultimately, the apparatus 100a for switching a radio frequency signal transmission route may reduce the attenuation and non-linearity of a radio frequency signal according to switching of a radio frequency signal transmission route while providing a device for switching a radio frequency signal transmission route. Further, the apparatus 100a may provide various transmission routes of a radio frequency signal using a comparatively small number of inductors.

Additionally, a size of the inductor may decrease as a reference frequency of a radio frequency signal increases, and thus, the apparatus 100a for switching a radio frequency signal transmission route of the exemplary embodiments may be more effective in switching a transmission route of a radio frequency signal of a frequency (e.g., 28 GHz, 60 GHz) corresponding to a millimeter wave.

Accordingly, a center frequency of a radio frequency signal pass band of the first and second inductors 111 and 112 may be implemented to be higher than 20 GHz. The center frequency may be determined by parasitic capacitance of the apparatus 100a and the inductance of the first and second inductors 111 and 112.

Figure 2A:
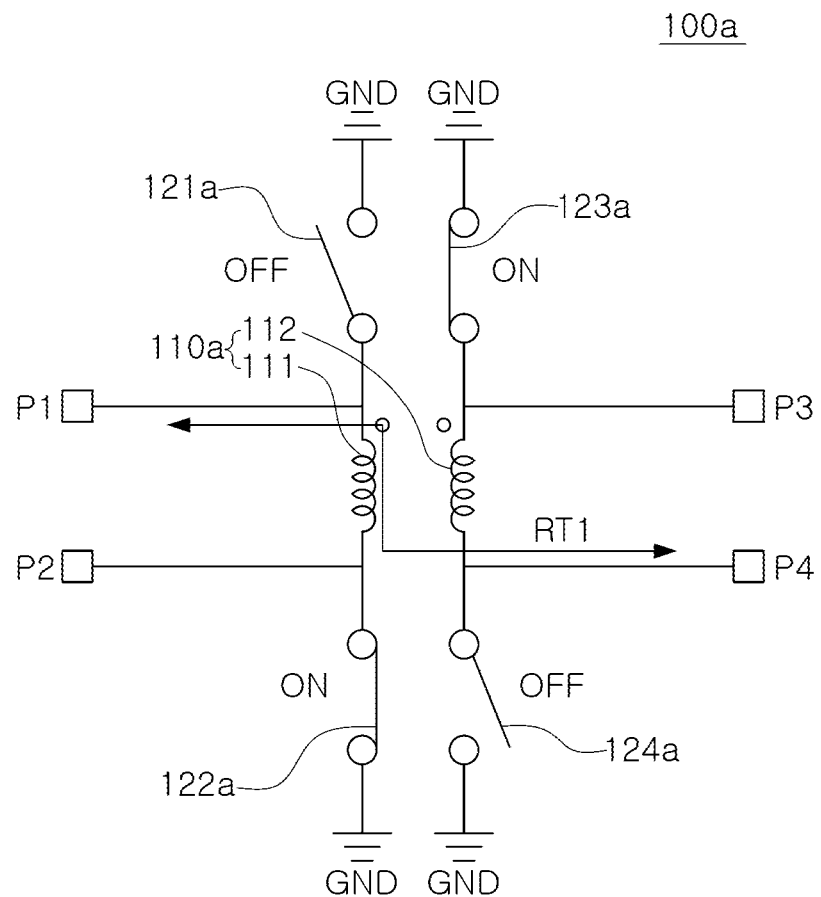
FIGS. 2A and 2B are illustrate a first transmission route mode of an example apparatus for switching a transmission route of a radio frequency signal according to one or more exemplary embodiments.
Figure 2B:
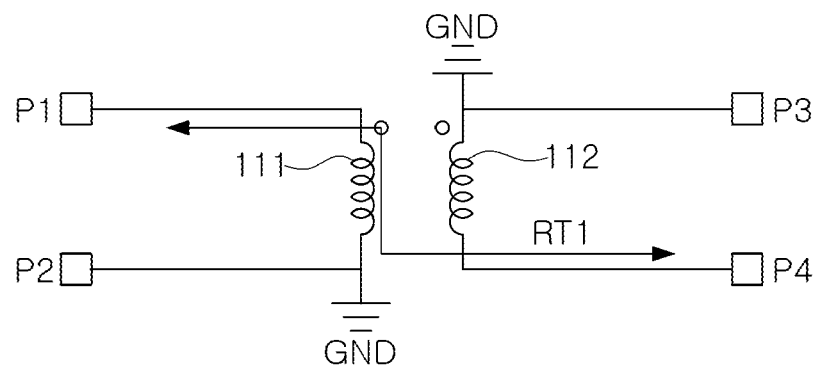

FIGS. 2A and 2B illustrated a first transmission route mode of an example apparatus for switching a transmission route of a radio frequency signal, in accordance with one or more exemplary embodiments.

Referring to FIG. 2A, the first and second inductors 111 and 112 may operate in a first transmission route mode configured to provide a first transmission route RT1 between the first and fourth ports P1 and P4 when the second and third switches 122a and 123a are turned on (ON), and the first and fourth switches 121a and 124a are turned off (OFF).

Referring to FIG. 2B, the first transmission route mode may operate in an equivalent circuit in which the ground GND is connected only to a second terminal, among a first terminal and the second terminal, of the first inductor 111 and is connected only to the first terminal, among the first terminal and a second terminal, of the second inductor 112.

Figure 2C:
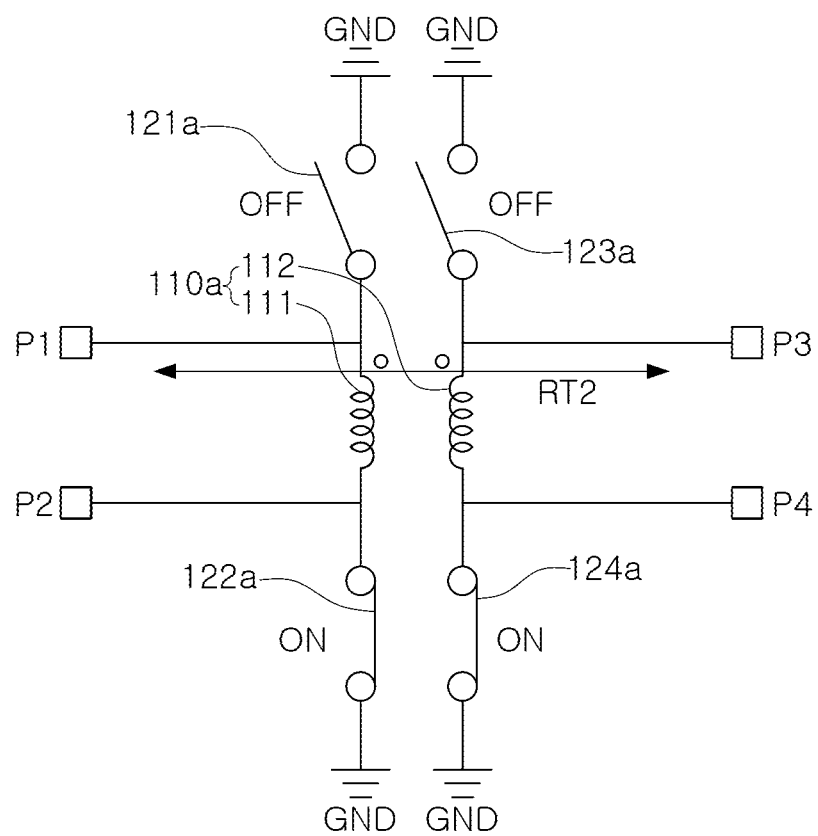
FIGS. 2C and 2D illustrate a second transmission route mode of an example apparatus for switching a transmission route of a radio frequency signal according to one or more exemplary embodiments.
Figure 2D:
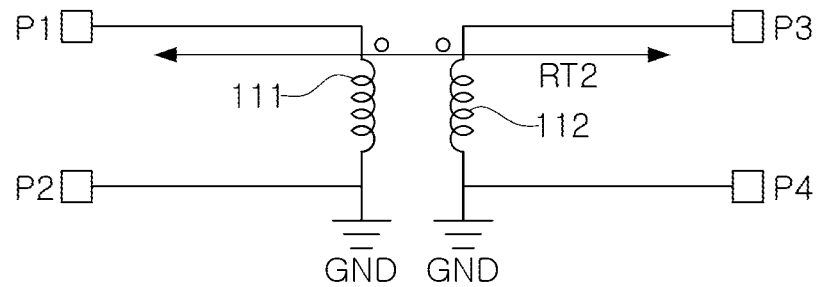

FIGS. 2C and 2D are diagrams illustrating a second transmission route mode of an apparatus for switching a transmission route of a radio frequency signal according to one or more exemplary embodiments.

Referring to FIG. 2C, the first and second inductors 111 and 112 may operate in a second transmission route mode configured to provide a second transmission route RT2 between the first and third ports P1 and P3 when the second and fourth switches 122a and 124a are turned on (ON) and the first and third switches 121a and 123a are turned off (OFF).

Referring to FIG. 2D, the second transmission route mode may operate in an equivalent circuit in which the ground GND is connected only to the second terminal, among the first terminal and the second terminal, of the first inductor 111, and is connected only to the second terminal, among the first terminal and the second terminal, of the second inductor 112.

Figure 2E:
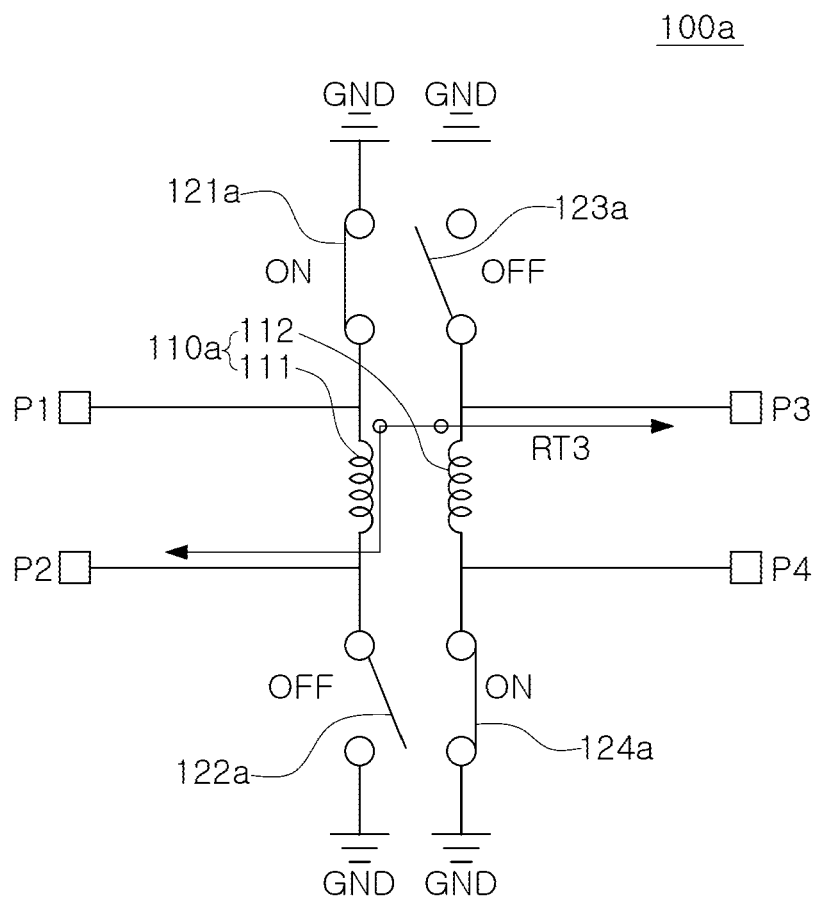
FIGS. 2E and 2F illustrate a third transmission route mode of an example apparatus for switching a transmission route of a radio frequency signal according to one or more exemplary embodiments.
Figure 2F:
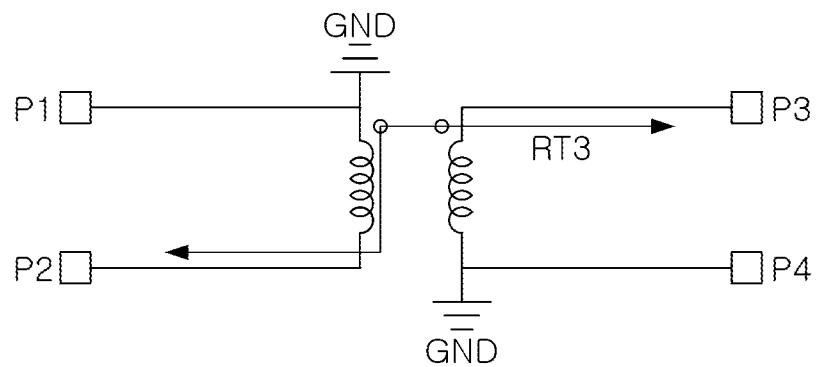

FIGS. 2E and 2F illustrate a third transmission route mode of an apparatus for switching a transmission route of a radio frequency signal, in accordance with one or more exemplary embodiments.

Referring to FIG. 2E, the first and second inductors 111 and 112 may operate in a third transmission route mode configured to provide a third transmission route RT3 between the second and third ports P2 and P3 when the first and fourth switches 121a and 124a are turned on (ON), and the second and third switches 122a and 123a are turned off (OFF).

Referring to FIG. 2F, the third transmission route mode may operate in an equivalent circuit in which the ground GND is connected only to the first terminal, among the first terminal and the second terminal, of the first inductor 111, and is connected only to the second terminal, among the first terminal and the second terminal, of the second inductor 112.

Figure 2G:
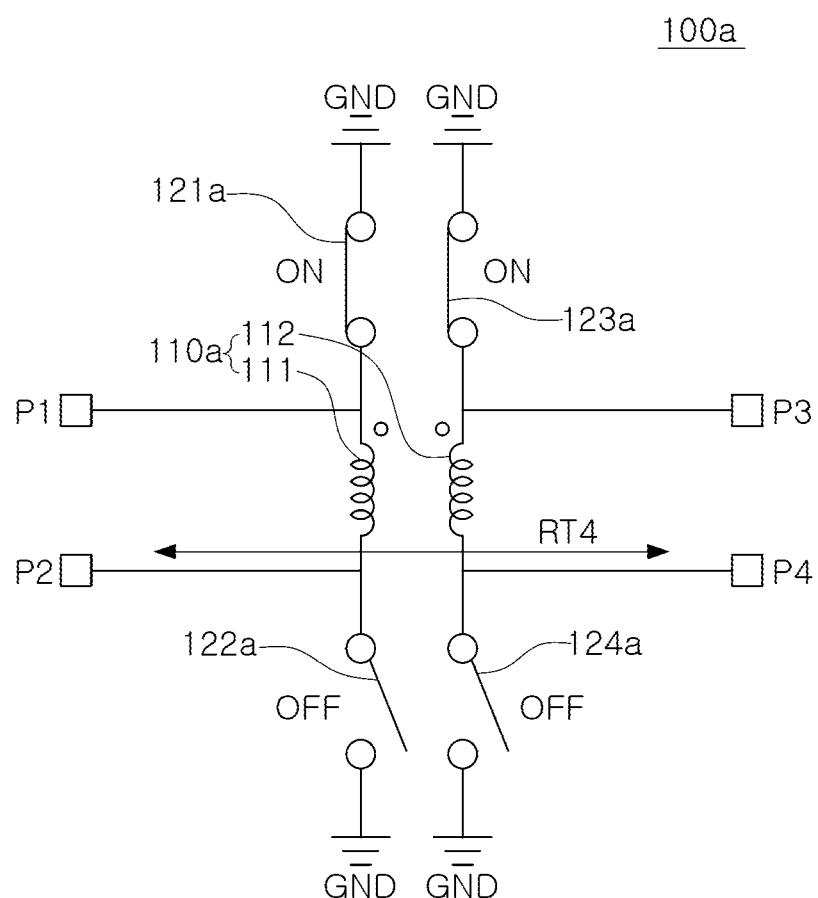
FIGS. 2G and 2H illustrate a fourth transmission route mode of an example apparatus for switching a transmission route of a radio frequency signal according to one or more exemplary embodiments.
Figure 2H:
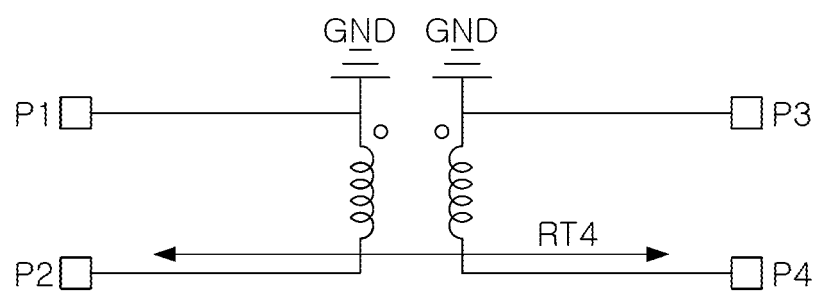

FIGS. 2G and 2H illustrate a fourth transmission route mode of an apparatus for switching a transmission route of a radio frequency signal, in accordance with one or more exemplary embodiments.

Referring to FIG. 2G, the first and second inductors 111 and 112 may operate in a fourth transmission route mode configured to provide a fourth transmission route RT4 between the second and fourth ports P2 and P4 when the first and third switches 121a and 123a are turned on (ON), and the second and fourth switches 122a and 124a are turned off (OFF).

Referring to FIG. 2H, the fourth transmission route mode may operate in an equivalent circuit in which the ground GND is connected only to the first terminal, among the first terminal and the second terminal, of the first inductor 111, and is connected only to the first terminal, among the first terminal and the second terminal, of the second inductor 112.

Referring to FIGS. 2A to 2H, the apparatus 100a for switching a radio frequency signal transmission route may operate in one of the first to fourth transmission route modes.

For example, the apparatus 100a for switching a radio frequency signal transmission route may operate in a time division duplex (TDD) manner, and may be switched to the first to fourth transmission route modes in order at a predetermined time. That is, the first to fourth transmission route modes of the apparatus 100a may be repeated at every reference cycle.

Figure 3:
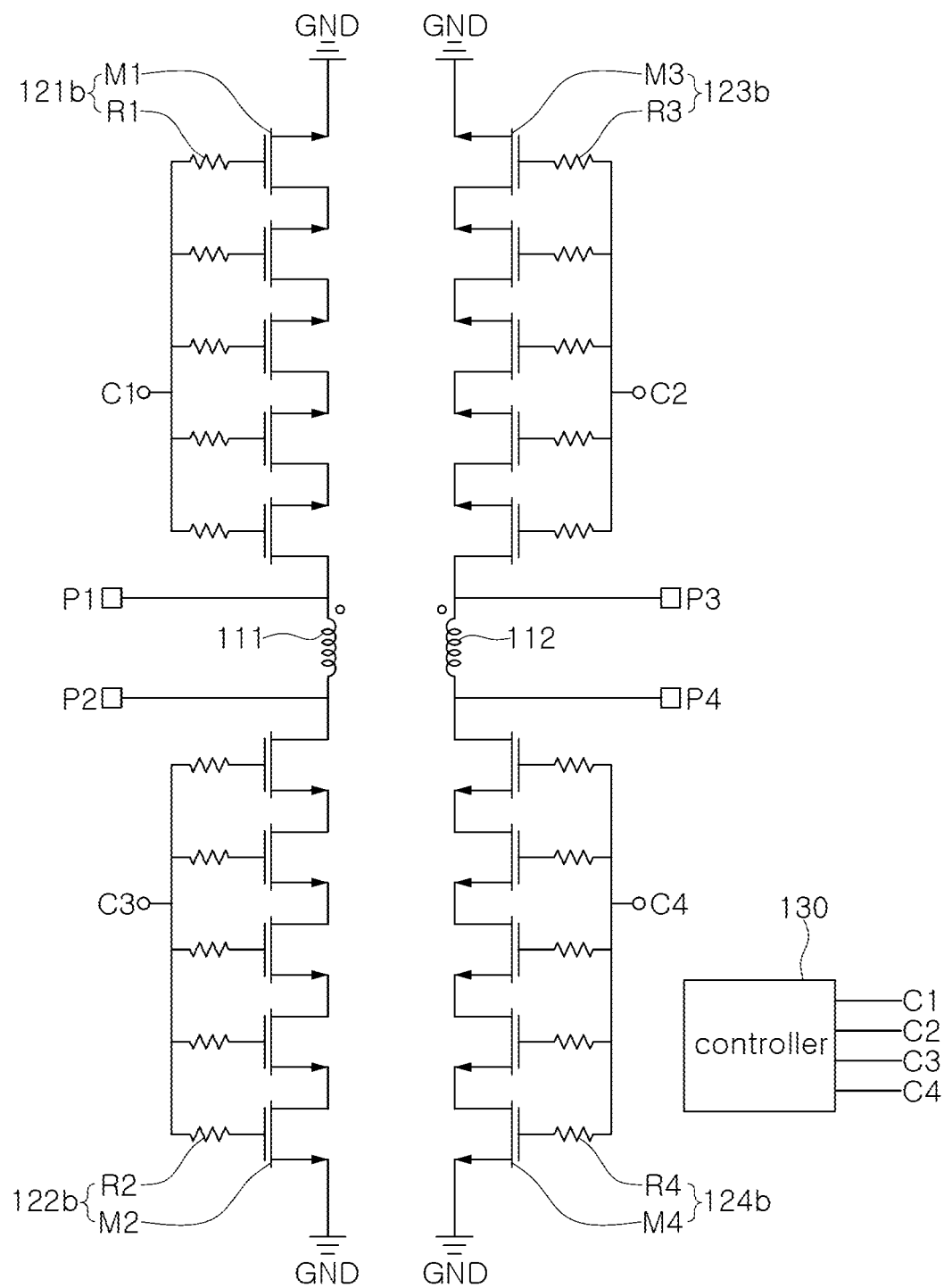
FIG. 3 illustrates an example controller and an example plurality of transistors, which are included in an example apparatus for switching a transmission route of a radio frequency signal according to one or more exemplary embodiments.

FIG. 3 illustrates a controller and a plurality of transistors, which may be included in an apparatus for switching a transmission route of a radio frequency signal, in accordance with one or more exemplary embodiments.

Referring to FIG. 3, an apparatus 100b for switching a transmission route of a radio frequency signal in accordance with one or more exemplary embodiments may include a controller 130 and a plurality of first to fourth transistors M1 to M4, and may further include a plurality of first to fourth gate resistances R1, R2, R3, and R4.

The controller 130 may provide first to fourth control signals C1, C2, C3, and C4 respectively to the first to fourth switches 121b to 124b such that one of the first to fourth transmission routes is selected. For example, the controller 130 may include at least one of a decoder, a level shifter and a buffer, and may produce the first to fourth control signals C1 to C4 corresponding to an input value from a communication modem or an RFIC.

The first to fourth switches 121b to 124b may have a structure in which a plurality of transistors corresponding to a plurality of first to fourth transistors M1 to M4 are serially connected to each other. In an example, the structure in which a plurality of the transistors are serially connected to each other may be a structure in which drain terminals and source terminals of a plurality of the transistors are alternately connected, and the first to fourth control signals C1 to C4 may be permitted as gate terminals of a plurality of the transistors.

Resistance values of a plurality of the first to fourth resistances R1 to R4 may affect a speed of switching an on/off state of the first to fourth switches 121b to 124b in accordance with the permission of the first to fourth control signals C1 to C4 and Q factors of the first and second inductors 111 and 112, and may be affected by channel widths of a plurality of the first to fourth transistors M1 to M4.

The first to fourth switches 121b to 124b may switch the on/off state in accordance with a voltage or a current of the first to fourth control signals C1 to C4.

Figure 4:
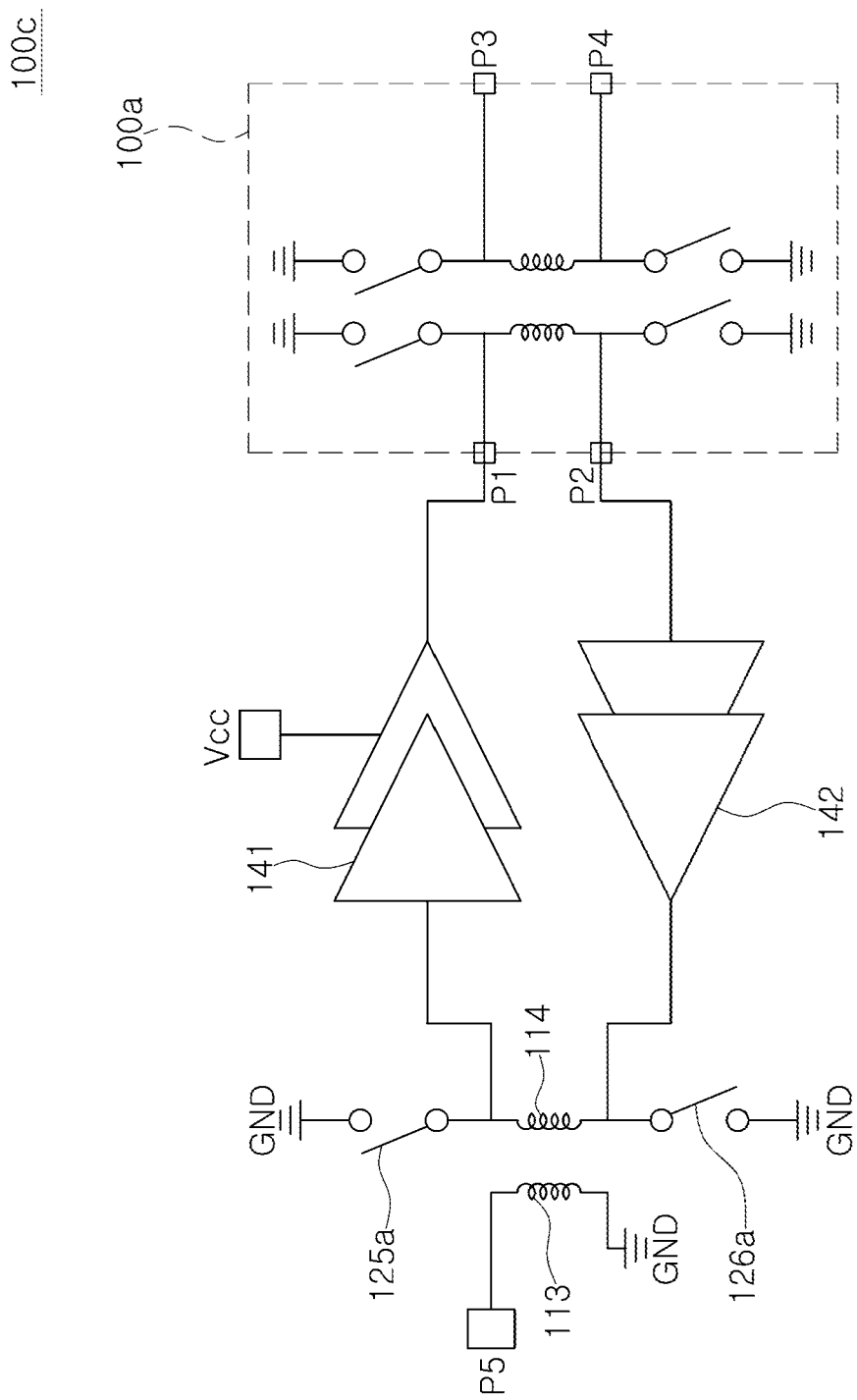
FIG. 4 is a diagram illustrating an example transmission amplifier, an example receiving amplifier, an example third inductor, an example fourth inductor, an example fifth switch, and an example sixth switch, which are included in an example apparatus for switching a transmission route of a radio frequency signal according to one or more exemplary embodiments.

FIG. 4 illustrates a transmission amplifier 141, a receiving amplifier 142, a third inductor 113, a fourth inductor 114, a fifth switch 125a and a sixth switch 126a, which may be included in an apparatus for switching a transmission route of a radio frequency signal, in accordance with one or more exemplary embodiments.

Referring to FIG. 4, an apparatus 100c for switching a transmission route of a radio frequency signal, in accordance with one or more exemplary embodiments may include the apparatus 100a illustrated in FIG. 1, and may further include at least one of a transmission amplifier 141, a receiving amplifier 142, a third inductor 113, a fourth inductor 114, a fifth switch 125a and a sixth switch 126a.

The transmission amplifier 141 may amplify a transmission radio frequency signal to deliver the transmission radio frequency signal to the first port P1. In an example, the transmission amplifier 141 may include at least one power amplifier, and may have a structure in which a plurality of the power amplifiers is connected in parallel. The transmission amplifier 141 may further include a drive amplifier electrically connected to an input terminal of the power amplifier.

The receiving amplifier 142 may receive a receiving radio frequency signal from the second port P2 to amplify the receiving radio frequency signal. In a non-limiting example, the receiving amplifier 142 may include a low noise amplifier and may have a structure in which a plurality of low noise amplifiers are connected in parallel.

The apparatus 100c for switching a radio frequency signal transmission route, in accordance with one or more exemplary embodiments, may transmit a signal amplified by the transmission amplifier 141 to one of the third and fourth ports P3 and P4 and a receiving radio frequency signal received from one of the third and fourth ports P3 and P4 to the second port P2.

That is, the apparatus 100c may use the third and fourth ports P3 and P4 as a port for both transmission and reception while performing a transmission/reception switching operation with a single transformer or two inductors, and may therefore perform various functions without having an overall size significantly increased.

For example, the respective transmission and receiving amplifiers 141 and 142 may have a common gate or common source structure of at least one semiconductor transistor (e.g., BJT, FET, or the like) and may input an input signal through the gate/base terminal or a source/emitter terminal and output a signal amplified through the drain/collector terminal. The transmission and receiving amplifiers 141 and 142 may be provided with power source Vcc through the drain/collector terminal.

The third inductor 113 may be electrically connected between the fifth port P5 and the ground GND.

The fourth inductor 114 may be disposed to have mutual inductance with the third inductor 113, and may be electrically connected between an input terminal of the transmission amplifier 141 and an output terminal of the receiving amplifier 142.

The third and fourth inductors 113 and 114 may be implemented as transformers, and may be implemented in a similar manner to the first and second inductors.

The fifth switch 125a may switch an electrical connection between the input terminal of the transmission amplifier 141 and a ground GND.

The sixth switch 126a may switch an electrical connection between the output terminal of the receiving amplifier 142 and the ground GND.

When the fifth switch 125a is turned on and the sixth switch 126a is turned off, a radio frequency signal amplified in the receiving amplifier 142 may be transmitted to the fifth port P5.

When the fifth switch 125a is turned off and the sixth switch 126a is turned on, a radio frequency signal input in the fifth port P5 may be transmitted to the transmission amplifier 141.

That is, the fifth port P5 may be used as both a transmission port and a receiving port. A number of terminals of the apparatus 100c and a number of wirings connected to the terminals may be reduced, and an overall size of a radio frequency module may be reduced.

Figure 5A:
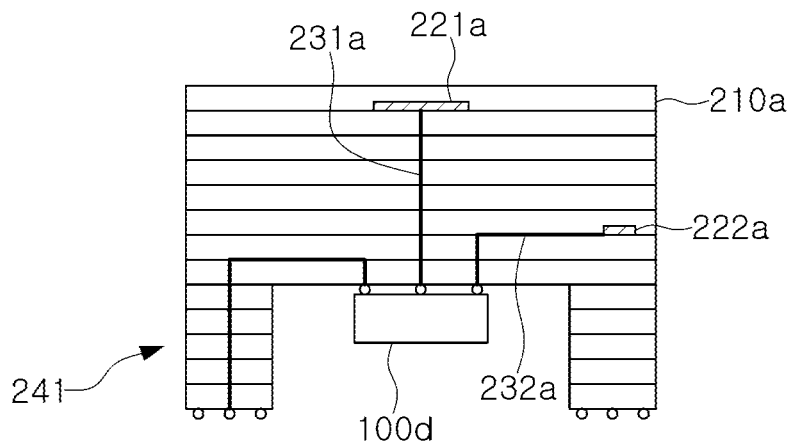
FIGS. 5A to 5C illustrate an example radio frequency module according to one or more exemplary embodiments.
Figure 5B:
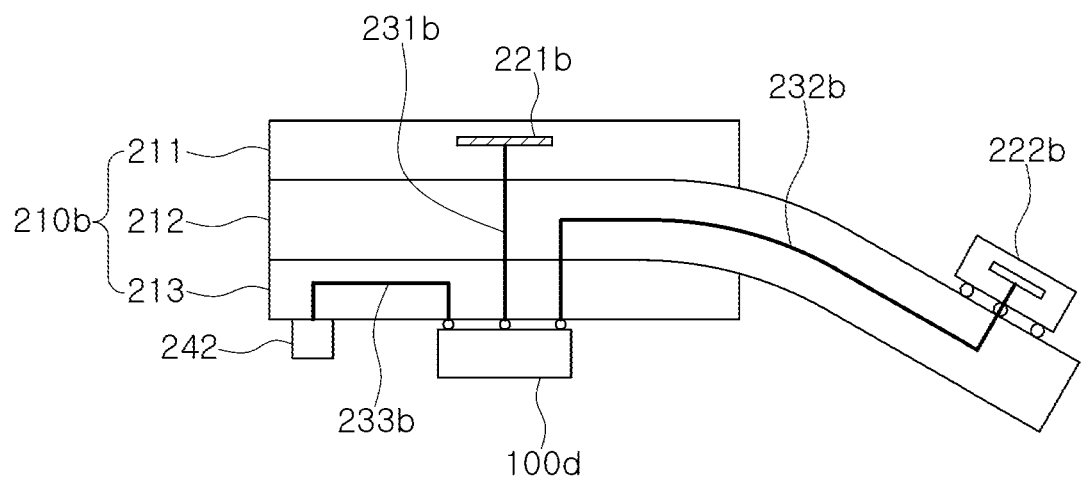
Figure 5C:
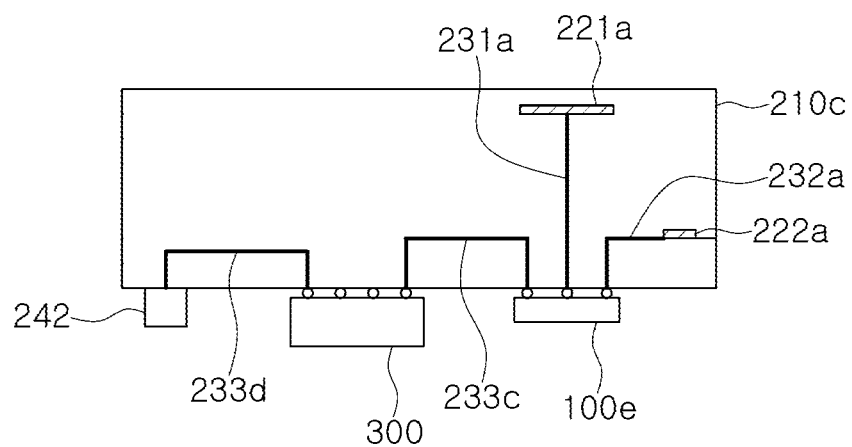

FIGS. 5A to 5C are diagrams illustrating a radio frequency module, in accordance with one or more embodiments.

Referring to FIG. 5A, a radio frequency module 200a, in accordance with one or more embodiments, includes a switch 100d for a radio frequency signal transmission route, and may further include at least one of a substrate 210a, a first antenna 221a and a second antenna 222a.

In an example, the switch 100d for a radio frequency signal transmission route may be identical or similar to the apparatus for switching a radio frequency signal transmission route described with reference to FIGS. 1 to 4, and may be disposed on the substrate 210a. In an example, the switch 100d for a radio frequency signal transmission route may be mounted on one surface of the substrate 210a when implemented as an integrated circuit.

The substrate 210a may be implemented as a printed circuit board and may have a structure in which a plurality of insulating layers and a plurality of wiring layers are alternatively stacked. The substrate 210a may further include a via electrically connecting a plurality of the wiring layers in a vertical direction.

The third and fourth ports of the apparatus for switching a radio frequency signal transmission route may respectively be electrically connected to the first and second antenna 221a and 222a through first and second feed routes 231a and 232a. The first and second feed routes 231a and 232a may be implemented by a combination of the via and the wiring of a plurality of the wiring layers of the substrate 210a.

The first antenna 221a may be configured to form a radiation pattern in a first direction (e.g., vertical direction) of the substrate 210a.

The second antenna 222a may be configured to form a radiation pattern in a second direction (e.g., horizontal direction) of the substrate 210a.

In this regard, the radio frequency module 200a in accordance with one or more embodiments, may transmit/receive a radio frequency signal in different directions, and a size of the radio frequency module 200a for transmitting/receiving a radio frequency signal in different directions may be easily reduced.

Accordingly, an electronic device, in which the radio frequency module 200a, in accordance with one or more embodiments, may be provided, can transmit/receive a radio frequency signal in different directions using a single radio frequency module 200a.

Further, the radio frequency module 200a, in accordance with one or more embodiments, may use the first antenna 221a for transmitting and receiving a signal as well as the second antenna 222a, and thus, a number of the first and second antennas 221a and 222a may be reduced by half. Additionally, a size of the substrate 210a can be easily reduced. In this regard, the radio frequency module 200a can have a further reduced size.

A total gain or a maximum output of the first and second antennas 221a and 222a may increase as a number of the first and second antennas 221a and 222a increases. Accordingly, the radio frequency module 200a, in accordance with one or more embodiments, may have improved performance twice the number of the first and second antennas 221a and 222a.

Further, the radio frequency module 200a may have the first and second feed routes 231a and 232a reduced by half by reducing the number of the first and second antennas 221a and 222a by half, and may thus have the substrate 210a more effectively reduced in size.

For example, the first antenna 221a may include at least one patch antenna disposed biased to a first direction (e.g., upward) from a center of the substrate 210a. For example, the patch antenna may be disposed on the wiring layer of the substrate 2101 or a ceramic dielectric disposed on an upper surface of the substrate 210a.

For example, the second antenna 222a may include at least one end-fire antenna disposed biased to a second direction (e.g., close to a side surface of the substrate) from a center of the substrate 210a. For example, the end-fire antenna may be implemented as a dipole antenna or a monopole antenna.

The radio frequency module 200a, in accordance with one or more embodiments, may further include a sub-substrate 241, and the sub-substrate 241 may be electrically connected to first and second ports of the switch 100d for a radio frequency signal transmission route or a fifth port.

Referring to FIG. 5B, a substrate 210b of a radio frequency module 200b according to one or more exemplary embodiments may include at least one of first and third insulating layers 211 and 213, and may include a second insulating layer 212 stacked on an upper or lower surface of the first or third insulating layer 211 or 213, having a portion non-overlapped in a stacking direction (e.g., vertical direction). In a non-limiting example, the second insulating layer 212 may be more flexible than the first or third insulating layer 211 or 213.

In an example, the second insulating layer 212 may be more flexible than the first and third insulating layers 211 and 213 by containing a polyimide or a liquid crystal polymer (LCP).

A first antenna 221b may be disposed on the first and second insulating layers 211 and 212 to overlap in the stacking direction, while a second antenna 222b may be disposed in a portion in the second insulating layer 212, non-overlapped with the first insulating layer 211 in the stacking direction.

As the second insulating layer 212 is bent, the first and second antennas 221b and 222b may form radiation patterns in different directions.

The first and second antennas 221b and 222b may be electrically connected to the switch 100d for a radio frequency signal transmission route through the first and second feed routes 231b and 232b.

The radio frequency module 200b according to one or more exemplary embodiments may further include a connector 242, and the connector 242 may be electrically connected to the first and second ports of the switch 100d or the fifth port.

The sub-substrate 241 and the connector 242 may be electrically connected to a base substrate of an electronic device in which the radio frequency module 200b can be provided. The base substrate may provide a space for arranging a communication modem and a baseband integrated circuit.

Referring to FIG. 5C, a radio frequency module 200c according to one or more exemplary embodiments may further include a switch 100e for a radio frequency signal transmission route and a radio frequency integrated circuit (RFIC) 300.

The RFIC 300 may be spaced apart from the switch 100e, and may be input or output with a base signal, and may deliver and/or receive a radio frequency signal having a higher frequency than the base signal to and/or from the switch 100e for a radio frequency signal transmission route.

In an example, the RFIC 300 may produce a radio frequency signal by producing a carrier signal and mixing the carrier signal with a base signal, and may filter or phase-control the radio frequency signal.

When the switch 100e for a radio frequency signal transmission route and the RFIC 300 are separately implemented, the switch 100e may be designed to be more effective in amplifying a radio frequency signal and switching transmission/receiving of the radio frequency signal, and may have a wider heat dissipation route when compared to the example in which the switch 100e for a radio frequency signal transmission route and the RFIC 300 are implemented as a single integrated circuit. In this regard, overall communication performance of the radio frequency module 200*c* may be effectively improved.

Figure 6A:
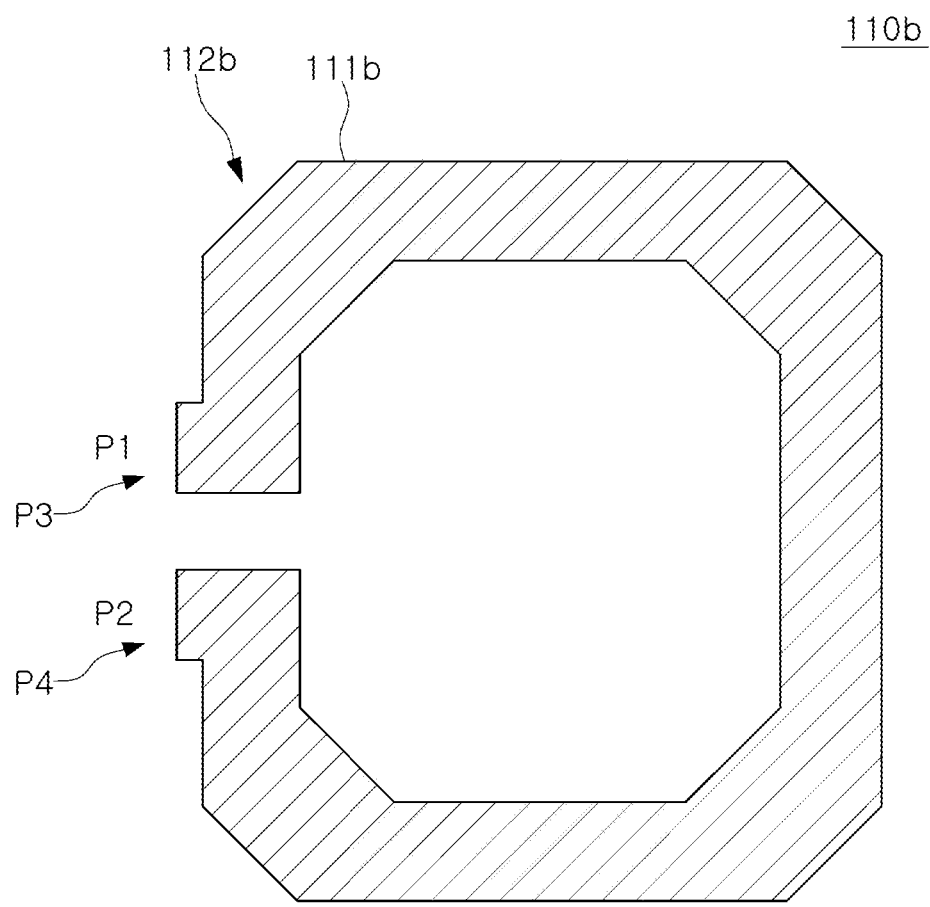
FIGS. 6A to 6C illustrate arrangements of first and second inductors of an example apparatus for switching a transmission route of a radio frequency signal according to one or more exemplary embodiments.
Figure 6B:
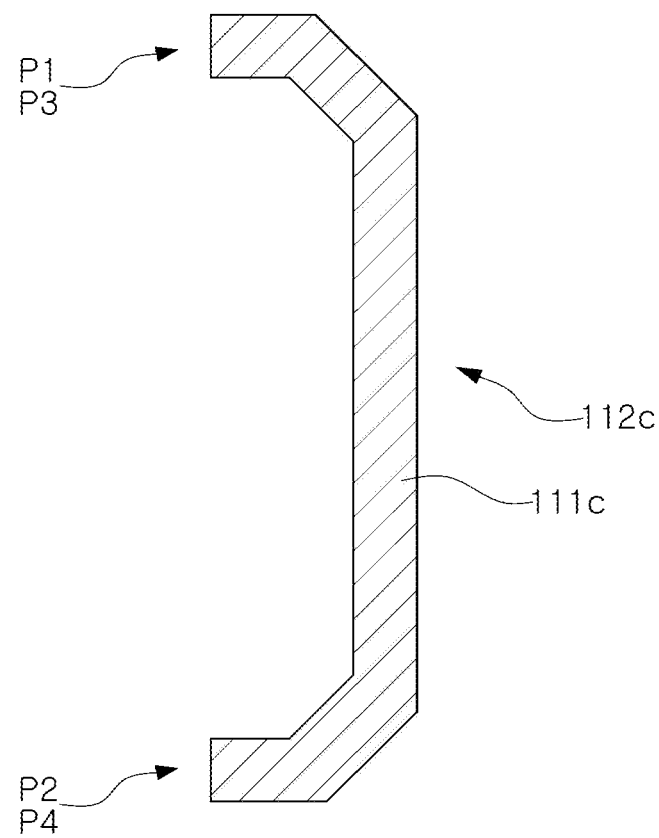
Figure 6C:
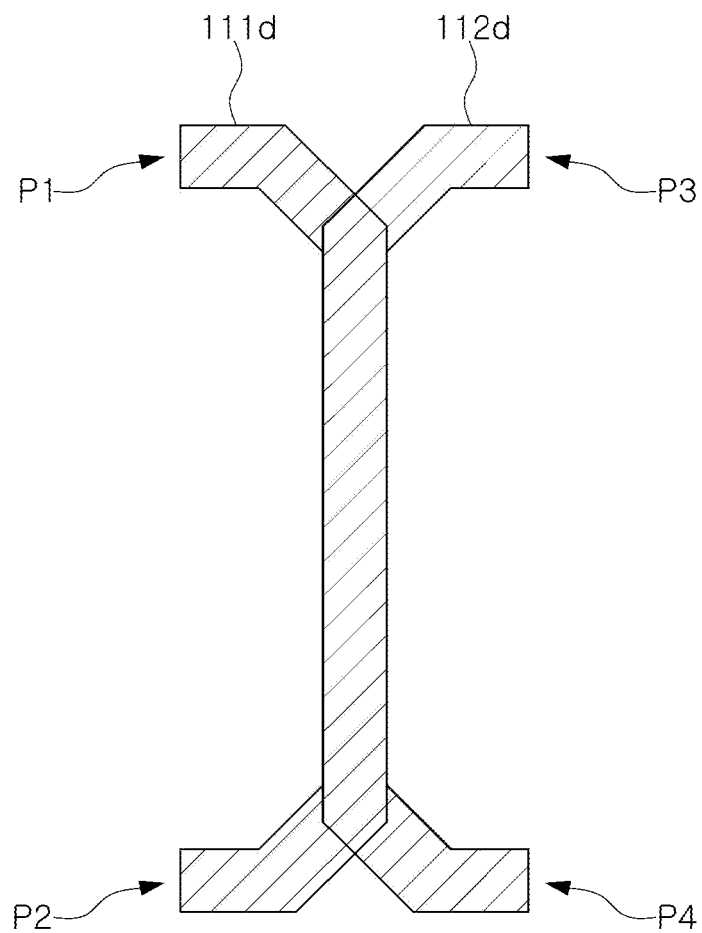

FIGS. 6A to 6C illustrate example arrangements of first and second inductors of an example apparatus for switching a transmission route of a radio frequency signal in accordance with one or more exemplary embodiments.

Referring to FIGS. 6A to 6C, first and second inductors 111*b*, 111*c*, 111*d*, 112*b*, 112*c* and 112*d* of transformers 110*b*, 110*c* and 110*d* may be disposed such that an area overlapping in a winding direction is larger than non-overlapped area.

Accordingly, an overall size of the apparatus for switching a transmission route of a radio frequency signal according to one or more exemplary embodiments may be further reduced, and an insertion loss may also further be reduced.

Meanwhile, the electronic device disposed herein may be, as non-limiting examples, a smart phone, a personal digital assistant, a digital video camera, a digital still camera, a network system, a computer, a monitor, a tablet, a laptop, a netbook, a television, a video game, a smart watch, an automotive component, or the like, but is not limited thereto.

A radio frequency signal disclosed herein may have a form according to protocols such as wireless fidelity (Wi-Fi; Institute of Electrical And Electronics Engineers (IEEE) 802.11 family, or the like), worldwide interoperability for microwave access (WiMAX; IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, and any wireless and wired protocols designated as 3G, 4G, 5G, and beyond, but is not limited thereto.

As described above, an apparatus for switching a transmission route of a radio frequency signal and a radio frequency module according to one or more exemplary embodiments can reduce non-linearity and attenuation of a radio frequency signal according to switching of a radio frequency signal transmission route while providing a device for switching the radio frequency signal transmission route and may use a comparatively small number of inductors to provide various frequency signal transmission routes.

While this disclosure includes specific examples, it will be apparent after an understanding of the disclosure of this application that various changes in forms and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A transmission route radio frequency signal switching apparatus, comprising:
 a first inductor electrically connected to a first port and a second port, among the first port, the second port, a third port, and a fourth port, each configured to allow a radio frequency signal to pass therethrough;
 a second inductor electrically connected to the third port and the fourth port, and disposed to have mutual inductance with the first inductor;
 a first switch configured to switch an electrical connection between the first port and a ground;
 a second switch configured to switch an electrical connection between the second port and the ground;
 a third switch configured to switch an electrical connection between the third port and the ground;
 a fourth switch configured to switch an electrical connection between the fourth port and the ground;
 a transmission amplifier;
 a receiving amplifier;
 a third inductor, electrically connected between a fifth port and the ground; and
 a fourth inductor disposed to have mutual inductance with the third inductor, and electrically connected between an input terminal of the transmission amplifier and an output terminal of the receiving amplifier;
 wherein the first inductor and the second inductor are electrically connected to the ground through one of the first switch and the second switch, and one of the third switch and the fourth switch such that a radio frequency signal passes between one of the first port and the second port, and one of the third port and the fourth port.

2. The apparatus of claim 1, wherein the first inductor and the second inductor are configured to operate in one of:
 a first transmission route mode configured to provide a first transmission route between the first port and the fourth port when the second switch and the third switch are turned on, and the first switch and the fourth switch are turned off;
 a second transmission route mode configured to provide a second transmission route between the first port and the third port when the second switch and the fourth switch are turned on, and the first switch and the third switch are turned off;
 a third transmission route mode configured to provide a third transmission route between the second port and the third port when the first switch and the fourth switch are turned on, and the second switch and the third switch are turned off; and
 a fourth transmission route mode configured to provide a fourth transmission route between the second port and the fourth port when the first switch and the third switch are turned on, and the second switch and the fourth switch are turned off.

3. The apparatus of claim 2, further comprising a controller configured to respectively provide first to fourth control signals to the first to fourth switches such that one of the first to fourth transmission routes is selected.

4. The apparatus of claim 3, wherein at least one of the first to fourth switches comprises a plurality of transistors directly connected to each other, and
 wherein the plurality of the transistors are switched into an on/off state based on at least one of a voltage and a current of the first to fourth control signals.

5. The apparatus of claim 1, wherein:
the transmission amplifier is configured to amplify a transmission radio frequency signal and deliver the amplified transmission radio frequency signal to the first port; and
the receiving amplifier is configured to receive a receiving radio frequency signal from the second port and amplify the received receiving radio frequency signal.

6. The apparatus of claim 5, further comprising:
a fifth switch configured to switch an electrical connection between the input terminal of the transmission amplifier and the ground; and
a sixth switch configured to switch an electrical connection between the output terminal of the receiving amplifier and the ground.

7. The apparatus of claim 1, wherein the first inductor and the second inductor are disposed such that an overlapped area in a winding axis of the first inductor and the second inductor is bigger than a non-overlapped area.

8. The apparatus of claim 1, wherein a center frequency of a radio frequency signal pass band of the first inductor and the second inductor is higher than 20 GHz.

9. The apparatus of claim 1, wherein a first end of the second inductor is electrically connected to a first antenna, and a second end of the second inductor is electrically connected to a second antenna.

10. A radio frequency module, comprising:
a substrate;
a first antenna disposed on the substrate, and configured to form a first radiation pattern in a first direction of the substrate;
a second antenna disposed on the substrate, and configured to form a second radiation pattern in a second direction of the substrate; and
a switch configured to control a radio frequency signal transmission route disposed on the substrate, and electrically connected to the first antenna and the second antenna,
wherein the switch configured to control a radio frequency signal transmission route comprises:
a transmission amplifier;
a receiving amplifier;
a second inductor electrically connected between the first antenna and the second antenna;
a first inductor disposed to have mutual inductance with the second inductor;
a first switch configured to switch an electrical connection between a first end of the first inductor and a ground;
a second switch configured to switch an electrical connection between a second end of the first inductor and the ground;
a third switch configured to switch an electrical connection between a first end of the second inductor and the ground;
a fourth switch configured to switch an electrical connection between a second end of the second inductor and the ground;
a third inductor; and
a fourth inductor, disposed to have mutual inductance with the third inductor, and electrically connected between an input terminal of the transmission amplifier and an output terminal of the receiving amplifier.

11. The module of claim 10, wherein:
the transmission amplifier is configured to amplify a transmission radio frequency signal, and deliver the amplified transmission radio frequency signal to the first end of the first inductor; and
the receiving amplifier is configured to receive a receiving radio frequency signal from the second end of the first inductor, and amplify the received receiving radio frequency signal.

12. The module of claim 11, further comprising a radio frequency integrated circuit (RFIC) disposed on the substrate to be spaced apart from the switch configured to control a radio frequency signal transmission route, and configured to input or output a base signal and deliver or receive a radio frequency signal having a higher frequency than a base signal to or from the switch configured to control a radio frequency signal transmission route.

13. The module of claim 12, further comprising:
a fifth switch configured to switch an electrical connection between the input terminal of the transmission amplifier and the ground; and
a sixth switch configured to switch an electrical connection between the output terminal of the receiving amplifier and the ground,
wherein a first end of the third inductor is electrically connected to the RFIC, and a second end of the third inductor is electrically connected to the ground.

14. The module of claim 10, wherein the first antenna comprises at least one patch antenna disposed biased to a first direction from a center of the substrate, and
the second antenna comprises at least one end-fire antenna disposed biased to a second direction from the center of the substrate.

15. The module of claim 10, wherein the substrate comprises a first insulating layer and a second insulating layer stacked on an upper surface or a lower surface of the first insulating layer, and the second insulating layer has a portion non-overlapped in a stacking direction, and is more flexible than the first insulating layer, and
the first antenna is disposed to overlap on the first insulating layer and the second insulating layer in the stacking direction, and the second antenna is disposed in a portion of the second insulating layer, non-overlapped with the first insulating layer in the stacking direction.

16. A device, comprising:
a controller;
a transmission amplifier;
a receiving amplifier;
a switching apparatus comprising:
a first port connected to an output port of the transmission amplifier;
a second port connected to an input port of the receiving apparatus;
a third port connected to a first antenna,
a fourth port connected to a second antenna;
a first inductor electrically connected to the first port and the second port;
a second inductor electrically connected to the third port and the fourth port;
a third inductor, electrically connected between a fifth port and the ground;
a fourth inductor disposed to have mutual inductance with the third inductor, and electrically connected between an input terminal of the transmission amplifier and an output terminal of the receiving amplifier; and
a plurality of switches configured to selectively switch electrical connections between the first port, the second port, the third port, and the fourth port and a ground based on control signals from the controller.

17. The device of claim 16, wherein each of the plurality of switches comprise a plurality of transistors connected in series.

\* \* \* \* \*